United States Patent
Tombelli

(10) Patent No.: US 10,381,916 B2
(45) Date of Patent: Aug. 13, 2019

(54) COMMON MODE AND DIFFERENTIAL MODE FILTER FOR AN INVERTER AND INVERTER COMPRISING SUCH FILTER

(71) Applicant: ABB Schweiz AG, Baden (CH)

(72) Inventor: Fabio Tombelli, Montelupo Fiorentino (IT)

(73) Assignee: ABB Schweiz AG, Baden (CH)

( * ) Notice: Subject to any disclaimer, the term of this patent is extended or adjusted under 35 U.S.C. 154(b) by 328 days.

(21) Appl. No.: 15/195,376

(22) Filed: Jun. 28, 2016

(65) Prior Publication Data

US 2017/0005566 A1    Jan. 5, 2017

(30) Foreign Application Priority Data

Jul. 1, 2015    (EP) .................................... 15174829

(51) Int. Cl.
*H01F 27/24* (2006.01)
*H02M 1/12* (2006.01)
(Continued)

(52) U.S. Cl.
CPC ................ *H02M 1/12* (2013.01); *H01F 3/10* (2013.01); *H01F 27/24* (2013.01); *H01F 27/28* (2013.01); *H01F 37/00* (2013.01); *H02M 1/126* (2013.01); *H02M 7/44* (2013.01); *H03H 7/0115* (2013.01); *H03H 7/1775* (2013.01); *H01F 2003/106* (2013.01); *H02M 2001/123* (2013.01)

(58) Field of Classification Search
CPC .................................. H01F 27/28; H01F 27/24

USPC ......... 336/83, 170, 178, 210, 212, 215, 233, 336/234
See application file for complete search history.

(56) References Cited

U.S. PATENT DOCUMENTS

| | | | |
|---|---|---|---|
| 4,531,108 A * | 7/1985 | Brandes | ................ H01F 27/245 336/178 |
| 2008/0174255 A1* | 7/2008 | Schnetzka | ............. F25B 49/025 318/12 |

(Continued)

FOREIGN PATENT DOCUMENTS

| | | | | |
|---|---|---|---|---|
| DE | 3305706 A1 | 8/1984 | | |
| EP | 2453450 A1 * | 5/2012 | ............... | H01F 3/10 |

(Continued)

OTHER PUBLICATIONS

European Patent Office, Extended Search Report issued in corresponding Application No. 15174829.0, dated Jan. 19, 2016, 10 pp.

*Primary Examiner* — Tszfung J Chan

(74) *Attorney, Agent, or Firm* — Taft Stettinius & Hollister LLP; J. Bruce Schelkopf

(57) ABSTRACT

A differential and common mode filter for an inverter, comprising an inductor having a core. The core comprises: an upper yoke and a lower yoke which comprise a first magnetic material; a first leg, a second leg and a third leg which extend between the upper and lower yokes and around which a first coil, a second coil, and a third coil are arranged, respectively, wherein at least one portion of the first, second and third legs, when seen in a transverse cross section, is made of one second magnetic material, and wherein the first magnetic material has a magnetic permeability higher than the second magnetic material; at least one unwound leg extending between the upper and lower yokes.

15 Claims, 5 Drawing Sheets

(51) Int. Cl.
*H01F 3/10* (2006.01)
*H01F 37/00* (2006.01)
*H01F 27/28* (2006.01)
*H02M 7/44* (2006.01)
*H03H 7/01* (2006.01)

(56) References Cited

U.S. PATENT DOCUMENTS

| | | | | |
|---|---|---|---|---|
| 2009/0174501 | A1* | 7/2009 | Parsche | H01F 21/08 333/174 |
| 2012/0200382 | A1* | 8/2012 | Hejny | H01F 3/10 336/212 |
| 2013/0033351 | A1* | 2/2013 | Kim | H01F 27/38 336/170 |
| 2014/0055226 | A1* | 2/2014 | Hsieh | H01F 17/04 336/212 |
| 2015/0002129 | A1* | 1/2015 | Ikriannikov | H01F 3/14 323/311 |
| 2015/0123479 | A1* | 5/2015 | Kurita | H01F 37/00 307/66 |

FOREIGN PATENT DOCUMENTS

| | | | |
|---|---|---|---|
| JP | 200748897 A | | 2/2007 |
| JP | 2007048897 A | * | 2/2007 |

* cited by examiner

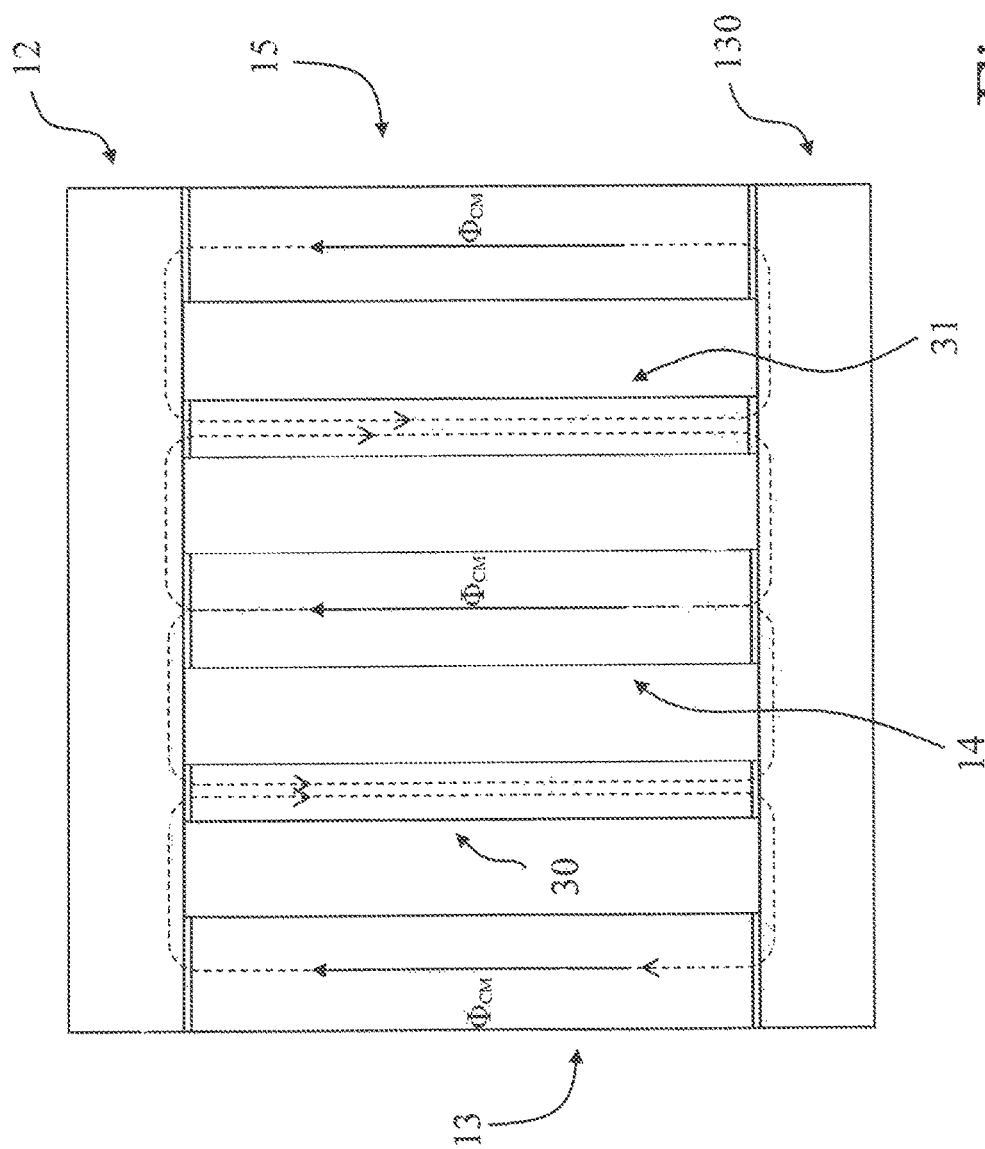

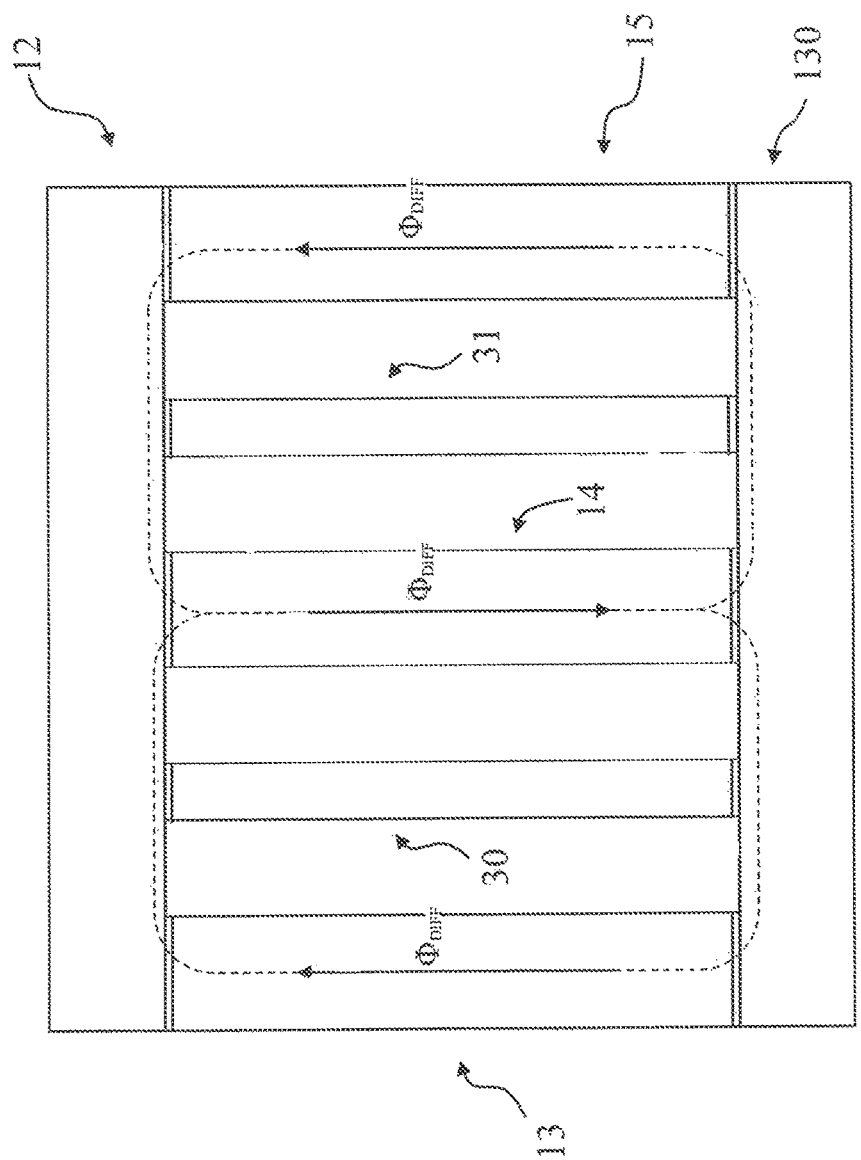

COMMON MODE AND DIFFERENTIAL MODE FILTER FOR AN INVERTER AND INVERTER COMPRISING SUCH FILTER

The present invention relates to a common mode and differential mode filter for an inverter, especially for the AC output side of an inverter suitable to be used in applications for renewable energy generation.

As known, inverters are power electronic devices which can he used in renewable energy applications for performing power conversion of a DC power received by one or more sources into an AC power.

Generally, a three-phase inverter comprises at least three output lines which are adapted to deliver the AC power to the phases of an AC grid or load associable to the inverter itself In particular, according, to known solutions, the three-phase inverter generates at its output AC side differential mode voltages and common mode voltages to earth, and related differential mode and common mode currents.

The inverter is adapted to work according to a grid connected mode, where the output lines are operatively connected to and provide the converted power to an AC grid, or to a stand-alone mode, where the outputs line are operatively connected and provide the converted power to one or more AC loads.

It is known to provide the AC output side of the inverter with differential mode low-pass filtering means, i.e. means adapted to filter higher frequency components of the differential mode AC outputs, while passing lower frequency components, This is specifically required for the inverter used in the grid-connected mode, in order to meet the operational requirements or standards of the AC grid.

Especially in view of high power applications, another important task is filtering high frequency components of the common mode AC outputs.

A known low-pass differential mode filter used in the inverters comprises a three-legs inductor, i.e. an inductor having only three core legs around which three coils are wound, each one associated to a corresponding output line of the inverter.

This filter provides only an adequate differential mode filtering. Indeed, the magnetic flux generated at the winding legs, due to the flowing of the common mode currents, is very low and hence, it results in a very low common mode filtering inductance.

A known common node and differential mode low-pass filter used in the inverters comprises three single-phase inductors, each one associated to a corresponding one of the three output lines. Even if each single-phase inductor provides an adequate common mode filtering as well as an adequate differential mode filtering of the corresponding line, due to adequately high common mode and differential mode inductive values, the use of three inductors is cumbersome, expensive, and implies a high power loss.

In light of above, at the current state of the art, although known solutions perform in a rather satisfying way, there is still reason and desire for further improvements.

Such desire is fulfilled by a differential and common mode filter for an inverter, comprising an inductor having a core. The core comprises:
  an upper yoke and a lower yoke which comprise a first magnetic material;
  a first leg, a second leg and a third leg which extend between the upper and lower yokes and around which a first coil, a second coil, and third coil are arranged, respectively, wherein at least one portion of the first, second and third legs, when seen in it transverse cross section, is made of one second magnetic material, and wherein the first magnetic material has a magnetic permeability higher than the magnetic permeability of the second magnetic material;
  at least one unwound leg extending between the upper and lower yokes.

The present invention is further related to an inverter comprising a filter as defined by the annexed claims and the following description and to a renewable energy generation system comprising such inverter.

Further characteristics and advantages will become more apparent from the description of some preferred but not exclusive embodiments according to the present invention, illustrated only by way of non-limiting examples with the aid of the accompanying drawings, wherein:

FIG. 4 illustrates the schematic section view of FIG. 2, with arrows for schematically depicting common mode magnetic fluxes; and FIG. 5 illustrates the schematic section view of FIG. 2, with arrows for schematically depicting differential mode magnetic fluxes.

Figure 1:
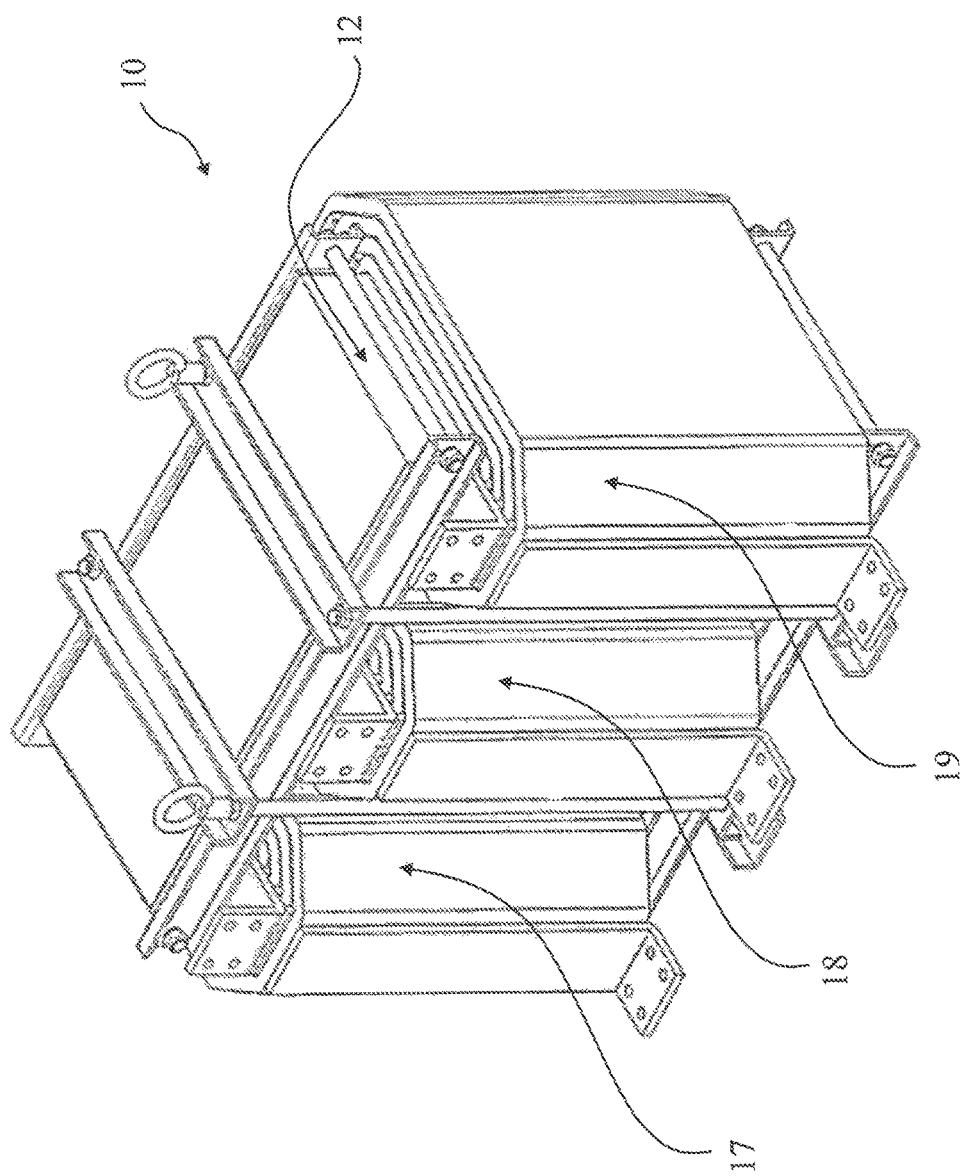
FIG. 1 is a perspective view of a three-phase inductor adapted to be used in a filter according to the present invention.

It should be noted that in the detailed description that follows, identical or similar components, either from a structural and/or functional point of view, have the same reference numerals, regardless of whether they are shown in different embodiments of the present disclosure; it should also be noted that in order to clearly and concisely describe the present disclosure, the drawings may not necessarily be to scale and certain features of the disclosure may be shown in somewhat schematic form.

Further, when the term "adapted" or "arranged" or "configured" or "shaped", is used herein while referring to any component as a whole, or to any part of a component, or to a whole combinations of components, or even to any part of a combination of components, it has to be understood that it means and encompasses correspondingly either the structure, and/or configuration and/or form and/or positioning of the related component or part thereof, or combinations of components or part thereof, such term refers to.

Finally, the term transversal or transversally hereinafter used encompasses a direction non-parallel to the clement or direction it is related to, and perpendicularity has to be considered a specific case of transverse direction.

With reference to the attached figures, the present disclosure is related to a differential and common mode filter 1 for an inverter 100, especially for an inverter 100 suitable for renewable energy applications, such as photovoltaic or wind applications.

Figure 3:
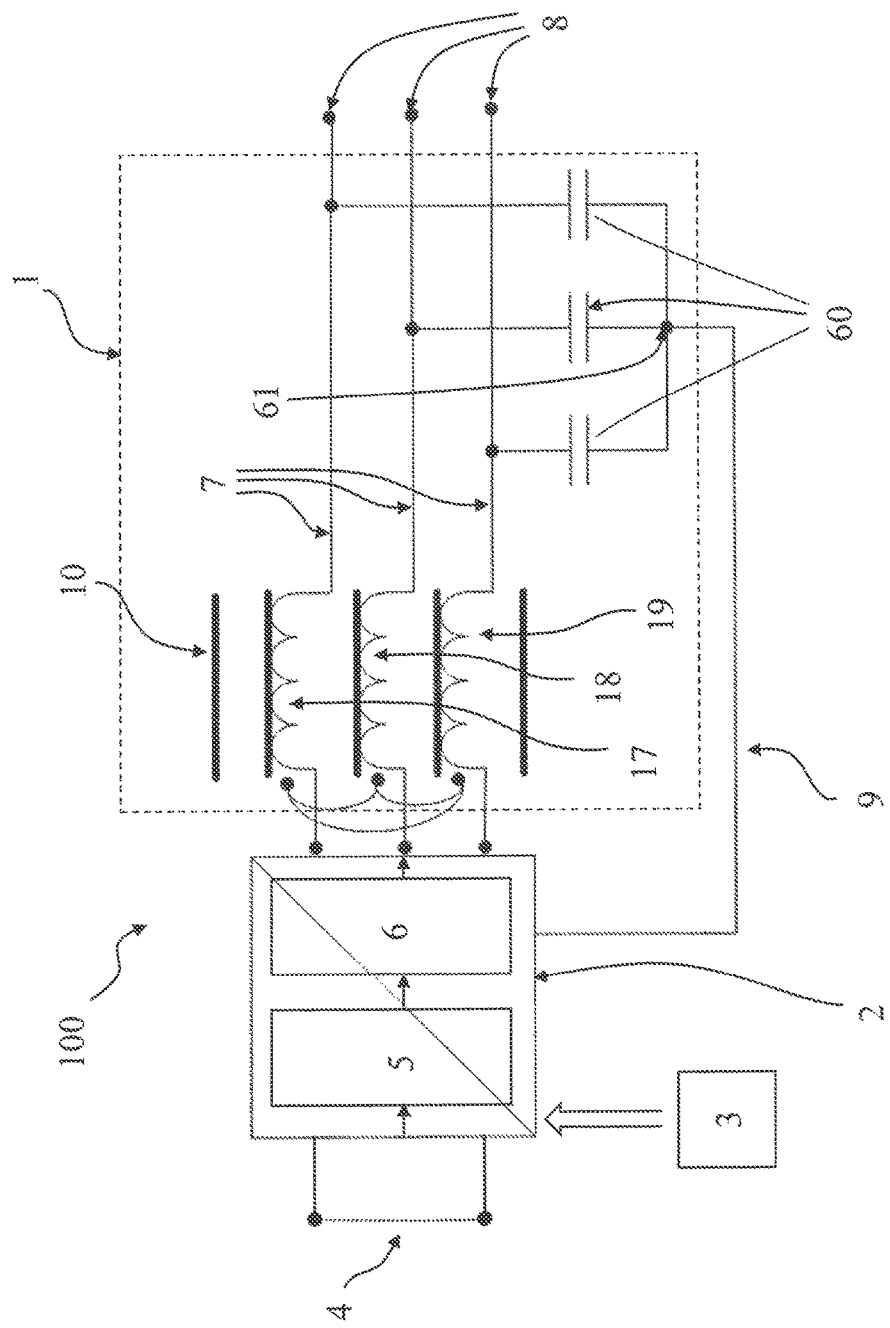
FIG. 3 is a schematic view, through a block diagram, of an inverter having a filter according to the present invention.

For example, FIG. 3 schematically illustrates an inverter 100 comprising electronic power conversion means 2 which are adapted to be controlled by control means 3 for converting into an AC power a DC power received in input through a plurality of DC input connectors 4 from one or more DC sources, such as photovoltaic panels or wind towers.

For example, the electronic power conversion means 2 can comprise a first DC/DC boosting stage 5 followed by a converting stage 6 having one or more electronic switching devices which can be controlled by the means 3 for converting the DC power in the AC power.

The inverter comprises at least three output conductive lines 7 leading from an output of the power conversion means 2 to respective AC connectors 8 which can he operatively connected to one or more AC grids or loads associable to the inverter 1 itself.

In practice, the three output lines 7 are adapted to conduct AC output signals generated by the power conversion means 2 to the AC connectors 8, in such a way to deliver the generated AC power to the one or more grids or loads connected to the connectors 8.

The means 3 are suitable for controlling the power conversion means 2 in such a way to generate the AC outputs of the inverter 100. In particular, the generated AC outputs comprise differential mode voltages and common mode voltages to earth, and related differential mode and common mode AC currents flowing through the output lines 7.

The inverter 1 further comprises a return line 9 which is suitably for providing a common current carrying return path for the three common mode currents flowing through the output lines 7.

For example, as illustrated in FIG. 3, the return line 9 is operatively connected to the three in output lines 7 and to a suitable connection point of the power conversion means 2, such as a connection point in DC/DC boosting stage 5.

Since the realization, functioning and control of above disclosed power conversion means 2, from an hardware and software point of view, are readily available to a person skilled in the art and not relevant for the scope and understanding of the present invention, they will not be described in particular details.

The inverter 100 comprises a differential mode and common mode low-pass filter 1, i.e. a filter suitable for filtering in an effective way:

higher frequency components of the differential mode outputted AC signals, while keeping in output lower frequency components as required by the AC grid or load to be fed; and high frequency components of the common mode outputted At signals.

Figure 2:
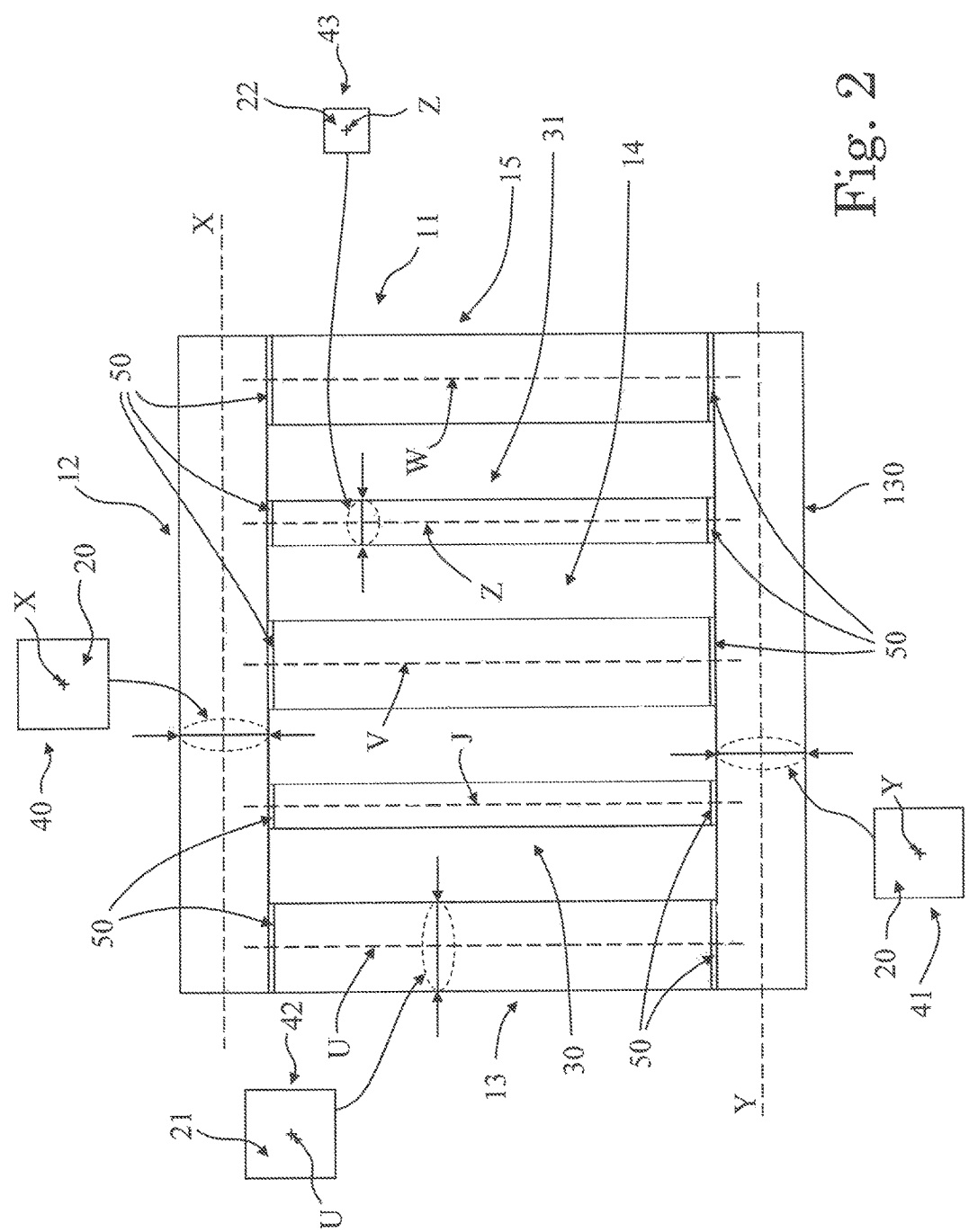
FIG. 2 is a schematic section view of a three-phase and five-legs inductor adapted to be used in a filter according to the present invention.

With reference to FIGS. 1-2., the filter 1 comprises one three-phase inductor 10 having a core 11.

The core 11 comprises an upper yoke 12 and a lower yoke 130 which longitudinally extend along respective main axes X and Y.

The core 11 comprises three legs 13, 14, 15 which extend between the upper and lower yokes 12, 130 along respective longitudinal axes U, V, W and around which a first coil 17, a second coil 18, and a third coil 19 of the inductor 10 are wound, respectively.

Each of the coils 17, 18 and 19 is operatively associated to a corresponding one of the three output lines 7, in such a way that the differential mode and the common mode currents generated by the power conversion means 2 can flow through the coils 17, 18, 19.

The core 11 further advantageously comprises at least one unwound leg 30, 31, a coil wound therearound, which extends between the. upper and lower jokes 12, 130. i.e. a leg without a coil wound therearound, which extends between the upper and lower yokes 12, 130.

For example, the core 11 illustrated in FIGS. 2, 4 and 5 comprises two unwound legs 30 and 31 extending between the upper and lower yokes 12, 130 along respective longitudinal axes J and Z. The at least one unwound leg 30, 31 is suitable for providing a low reluctance return path in the core 11 for the magnetic fluxes generated by the common mode currents flowing through the coils 17, 18, 19.

Without this return path, the common mode inductance of the filter 1 would have a low value, not enough to provide an effective attenuation of the high frequency components associated to the common mode AC outputs of the inverter 100. This is because in an inductor having only to three winding legs the total magnetic flux on each winding is given b the sum of vectors of the flux generated at the winding itself and of components of the fluxes generated at the other windings.

This would mean a low overall common mode magnetic flux at the winding legs 13, 14, 15 and, hence, a low common mode inductance $L_{COM}$ of the inductor 1. Having a low common mode inductance $L_{COM}$ means jeopardizing the common mode filtering capability of the filter 1.

FIG. 4 illustrates for example the main components of the common mode magnetic fluxes $\Phi_{CM}$ (without considering lower components) flowing into the exemplary illustrated core 11 and caused by the common mode currents in the coils 17, 18, 19.

With reference to such figure, each of the common mode fluxes $\Phi_{CM}$ generated at one of the winding legs 13, 14, 15, in order to close a magnetic loop, can reach, flow through, and return from the unwound legs 30, 31, instead of flowing through the other winding legs.

In this way, the overall common mode magnetic flax at each of the winding legs 13, 14, 15 is kept at a level high enough to provide an effective common mode inductance $L_{COM}$ of the inductor 1. An effective common mode inductance $L_{COM}$ means an inductance high enough to provide an effective common mode filtering capability of the filter 1.

FIG. 5 illustrates for example the main components of the differential mode magnetic fluxes $\Phi_D$ (without considering lower components) flowing into the exemplary illustrated core 11 and caused by the differential mode currents in the coils 17, 18, 19.

With reference to such FIG. 5, the differential mode magnetic fluxes $\Phi_D$ generated at the legs 13, 14, 15 link to each other for closing magnetic loops; the fluxes $\Phi_D$ mainly flow in the legs 13, 14 15 themselves, and not in the unwound legs 30, 31.

With reference to FIGS. 4 and 5 and considering that the generated common mode magnetic fluxes $\Phi_{CM}$ are several time lower than differential mode magnetic fluxes $\Phi_D$, the overall generated magnetic field in the core 11 is distributed as follows: the magnetic field is greater at the legs 13, 14, 15; the magnetic field is lower at the upper and lower yokes 12, 130; and the magnetic field at the unwound legs 30, 31 is higher than the field at the yokes 12, 130, but lower than the field at the legs 13, 14, 15.

The upper yoke 12 and the lower yoke 13 comprise a first magnetic material 20.

Preferably, with reference to FIG. 2, the upper yoke 12, when seen in a transversal cross section 40, i.e. a section transversal to the longitudinal axis X, and the lower yoke 130, when seen in a transversal cross section 41, i.e., a section transversal to the longitudinal axis Y, are made only of the first magnetic material 20.

More preferably, as in the exemplary embodiment illustrated in FIGS. 1 and 2, the upper and lower yokes 12 and 130 are entirely made of the first magnetic material 20.

Each of the legs 13, 14, 15 comprises at least one portion which, when seen in a transversal cross section, i.e. as cross section transversal to the respective axes U, V, W, comprises only one second magnetic material 21, For sake of simplicity, FIG. 2 illustrates for example only the transversal cross section 42 of the leg 13.

Preferably, according to the exemplary embodiment illustrated in FIGS. 1 and 2, each of the legs 13, 14, 15 is entirely made of the second magnetic material 21.

The first magnetic material 20 of the yokes 12, 130 has a magnetic permeability higher than the magnetic permeability of the second magnetic material 21 of the legs 13, 14, 15.

Providing the yokes 12, 130 and the legs 13, 14, 15 with such materials 20 and 21 having different permeability is particularly advantageous in view of the above disclosed distribution of the magnetic field in the core 11

Indeed, the second material 21 must have a magnetic permeability low enough to avoid magnetic saturations in the legs 13, 14, 15 despite of the high magnetic field present on it.

Due to the fact that a low magnetic field is present on the first magnetic material 20, this material 20 can have a higher magnetic permeability value with respect to the second material 21, while avoiding magnetic saturations in the yokes 12, 130.

A ratio of the magnetic permeability of the first magnetic material 20 to the magnetic permeability of the second magnetic material 21 has preferably a value between 500 and 1500, and more preferably between 800 and 1000.

For example, the first magnetic material 20 has a relative magnetic permeability with respect to the free space permeability comprised between 40000 and 60000, and the second magnetic material 21 has a relative magnetic permeability between 40 and 60.

Preferably, the at least one unwound kg 30, 31 provided in the core 11 comprises a third magnetic material 22.

With reference to the exemplary embodiment illustrated in FIG. 2, each of the unwound legs 30 and 31, when seen in a transversal cross section, i.e. a cross section transversal to the respective longitudinal axis and Z, comprises only the third magnetic material 22. For sake of simplicity, FIG. 2 illustrates for example only the transversal cross section 43 of the unwound leg 31. Preferably, according to the exemplary embodiment illustrated in FIG. 2, the provided unwound legs 30. 31 are entirely made of the third magnetic material 22.

The third magnetic material 22 has a magnetic permeability higher than the magnetic permeability of the second magnetic material 21 of the winding legs 13, 14, 15 and lower than the magnetic permeability of the first magnetic material 20 of the upper and lower yokes 12, 130. Providing the unwound legs 30, 31 with such a different material 22 with respect to the materials 20, 21 of the other parts of the core 11 is particularly advantageous in view of the above disclosed distribution of the magnetic field.

Indeed, since an intermediate magnetic field is present at the unwound legs 30, 31, a magnetic permeability intermediate between the magnetic permeabilities of the yokes 12, 130 and the legs 13, 14, 15 can be used, while avoiding magnetic saturations of the unwound legs 30, 31.

A ratio of the magnetic permeability of the third magnetic material 22 to the magnetic permeability of the second magnetic material 21 has preferably a value comprised between 50 and 150, and more preferably between 80 and 100.

For example, the third magnetic material 22 has a relative magnetic permeability with respect to the free space permeability comprised between 4000 and 6000.

Preferably, the magnetic reluctance of the one or more unwound legs 30, 31 provided in the core 11 is lower than the magnetic reluctance of the winding legs 13, 14, 15.

Preferably, the one or more unwound legs 30, 31 advantageously have a transversal cross section with a surface lower than the surface of the transversal cross sections of the legs 13, 14, 15. For example, in the embodiment illustrated in FIG. 2, the thickness of the two unwound legs 30, 31 is lower than the thickness of the legs 13, 14, 15.

The cross section surface of the unwound legs 30, 31 can he dimensioned lower than the cross section surface of the other legs 13, 14, 15 because the main common mode magnetic flux components $\Phi_{CM}$ flow through the legs 30, 31, while the main higher differential mode magnetic flux components $\Phi_D$ flow mainly in the legs 13, 14, 15.

According to the exemplary embodiment illustrated in FIGS. 1 and 2, the legs 13 and 15 are outer legs of the core 11, while the leg 14 is an inner leg which is disposed between the outer legs 13, 15.

Preferably, the at least one unwound leg 30, 31 comprises at least a first unwound leg 30 which is disposed between the outer leg 13 and the inner leg 14. More preferably, in the case that the core I comprises a second unwound leg 31, this second leg 31 is disposed between the outer leg 15 and the inner leg 14 as illustrated in the exemplary embodiment of FIG. 2.

This is particularly advantageous in view of the manufacturing process of the inductor 1; indeed, firstly the coils 17, 18, 19 are pre-wound around the corresponding legs 13, 14, 15, and then the structure of the core 11 is compacted.

During this compacting operation, the unwound legs 30, 31 are subjected to high mechanical stress.

However, a deformation of the lees 30, 31 due to this stress is avoided, or at least reduced, even if the legs 30, 31 can be thin, by the fact that the leg 30 is sandwiched between the coils 17 and 18 around the outer and inner legs 13 and 14; and the leg 31 is sandwiched between the coils 18 and 19 of the inner and outer legs 13 and 15.

Preferably, the inductor 10 advantageously comprises at least one air gap for increasing the saturation threshold of the core 11.

According to an exemplary embodiment, the winding legs 13, 14, 15, where the magnetic held is higher, comprise blocks made of the second magnetic material 21 which are stacked to each other and which are separated from each other by air gaps.

For example, the magnetic blocks can be stacked to each other using layers of adhesive material, such as glue. The layers of adhesive materials are advantageously air gaps between the stacked blocks.

In addition or alternatively to this solution, the inductor 1 can comprise an air gap 50 between at least one of the core legs 13, 14, 15, 30, 31 and at least one of the upper and lower yokes 12, 130, in the exemplary embodiment illustrated in FIG. 2, the inductor 1 comprises air gaps 50 between each of the legs 13, 14, 15, 30, 31 and the upper and lower yokes 12, 130.

With reference to FIG. 3, the filter 1 preferably comprises, in addition to the three-phase inductor 1, three capacitors 60, each one operatively connected with a corresponding one of the coils 17, 18, 10 of the inductor 10 in FIG. 3, the three capacitors 60 are for example connected to each other in a star connection. The return line 9 starts at the star connection point 61 between the capacitors 60.

In practice, it has been seen how the filter 1 comprising the three-phase inductor 10 allows achieving the intended object offering some improvements over known solutions.

In particular, due to the presence of at least one unwound leg 30, 31, the inductor 10 can provide a common mode inductance $L_{COM}$ having a value high enough to guarantee an effective common mode filtering capability for the filter 1, in addition to an effective differential mode filtering capability. This solution is cheaper and less cumbersome than providing three single-phase inductors, each one for a corresponding output line 7 of the inverter 100.

The differential and common mode filtering capabilities of the filter 10 are further increased by suitably using materials 20, 21, 22 in the core 11 with different magnetic permeabilities, in view of the distribution of the magnetic field in the core 11 itself.

In particular, the fact of having the first magnetic material 20 of the upper and lower yokes 12, 130 with a magnetic permeability greater than the second magnetic material 21 of the winding legs 13, 14, 15 allows to have greater common and differential mode inductances LCOM, Lo of the inductor 1, while avoiding saturations in the upper and lower yokes 12, 130.

According to the exemplary above disclosed embodiment, the value of the common and differential mode inductances $L_{COM}$, $L_D$ can be further increased by using the third magnetic material 22 for the one or more unwound legs 30, 31. Indeed, even if the magnetic permeability of the material 22 is lower than the magnetic permeability of the first magnetic material 20, in order to avoid saturation at the unwound legs 30, 31, such magnetic permeability is greater than the magnetic permeability of the second magnetic material 21 used for the winding legs 13, 14, 15.

The filter 1 thus conceived, and related inverter 100, are also susceptible of modifications and variations all of which are within the scope of the inventive concept as defined in particular by the appended claims.

For example, even if in the exemplary embodiment illustrated in the attached figures the core 11 comprises two unwound legs 30, 31, the core 11 of an inductor 1 according to the present invention can have only one or more than two unwound legs.

For example, even if in the exemplary embodiment illustrated in the attached figures the inductor 1 comprises air gaps 50 between each one of the wound and unwound legs 13, 14, 15, 30, 31 and the upper and lower yokes 12, 130, the inductor 1 could comprise it gaps 50 only between some of the wound and unwound legs 13, 14, 15, 30 and one of or both the upper and lower yokes 12, 130.

The invention claimed is:

1. A differential and common mode filter for an inverter, comprising an inductor having a core, said core comprises:
    an upper yoke and a lower yoke which comprise a first magnetic material;
    a first leg, a second leg and a third leg which extend between said upper and lower yokes and around which a first coil, a second coil, and a third coil are arranged, respectively, wherein at least one portion of said first, second and third legs, when seen in a transverse cross section, is made of a second magnetic material, and wherein said first magnetic material has a magnetic permeability higher than the magnetic permeability of the second magnetic material;
    at least one unwound leg extending between said upper and lower yokes;
    wherein said at least one unwound leg comprises a third magnetic material having magnetic permeability higher than the magnetic permeability of the second magnetic material and lower than the magnetic permeability of the first magnetic material.

2. The filter according to claim 1, wherein said first and third legs are outer legs of the core, said second leg is an inner leg disposed between said first and third outer legs, and said at least one unwound leg comprises at least a first unwound leg disposed between said first outer leg and said second inner leg.

3. The filter according to claim 2, wherein said at least one unwound leg comprises a second unwound leg disposed between said second inner leg and said outer third leg.

4. The filter according to claim 2, wherein said at least one unwound leg has a transversal cross section having a surface lower than the surface of the transversal cross section of said first, second and third legs.

5. The filter according to claim 1, wherein said at least one unwound leg has a transversal cross section having a surface lower than the surface of the transversal cross section of said first, second and third legs.

6. The filter according to claim 1, wherein said at least one unwound leg has a magnetic reluctance lower than the magnetic reluctance of said first, second and third legs.

7. The filter according to claim 1, wherein said inductor comprises at least one air gap.

8. The filter according to claim 7, wherein at least one of said first, second and third legs comprises a stack of blocks made by said second magnetic material and separated from each other by air gaps.

9. The filter according to claim 8, wherein said blocks are stacked to each other by layers of adhesive material.

10. The filter according to claim 1, wherein said inductor comprises an air gap between at least one of said first, second, third and unwound legs and at least one of said upper and lower yokes.

11. The filter according to claim 1, wherein a ratio of the magnetic permeability of the first magnetic material to the magnetic permeability of the second magnetic material has a value between 500 and 1500.

12. The filter according to claim 1, wherein a ratio of the magnetic permeability of said third magnetic material to the magnetic permeability of the second magnetic material has a value between 50 and 150.

13. The filter according to claim 1, further comprising three capacitors, each of said three capacitors being connected with a corresponding one of said first, second and third coils.

14. An apparatus, comprising:
    an inverter;
    a filter including an inductor having a core, said core comprises:
        an upper yoke and a lower yoke which comprise a first magnetic material;
        a first leg, a second leg and a third leg which extend between said per and lower yokes and around which a first coil, a second coil, and a third coil are arranged, respectively, wherein at least one portion of said first, second and third legs, when seen in a transverse cross section is made of a second magnetic material, and wherein said first magnetic material has a magnetic permeability higher than the magnetic permeability of the second magnetic material;
        at least one unwound leg extending between said upper and lower yokes;
        wherein said at least one unwound leg comprises a third magnetic material having magnetic permeability higher than the magnetic permeability of the second magnetic material and lower than the magnetic permeability of the first magnetic material.

15. The apparatus of claim 14, wherein the apparatus is a renewable energy generation system.

* * * * *